United States Patent
Hisayasu et al.

(10) Patent No.: US 7,304,533 B2
(45) Date of Patent: Dec. 4, 2007

(54) INTEGRATED CHANNEL FILTER USING MULTIPLE RESONANT FILTERS AND METHOD OF OPERATION

(75) Inventors: Philip T. Hisayasu, Richardson, TX (US); Michael D. Womac, McKinney, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 11/107,167

(22) Filed: Apr. 15, 2005

(65) Prior Publication Data

US 2006/0232329 A1 Oct. 19, 2006

(51) Int. Cl.
*H03K 5/00* (2006.01)

(52) U.S. Cl. .................... 327/553; 327/552; 327/557

(58) Field of Classification Search ......... 327/552–559
See application file for complete search history.

(56) References Cited

U.S. PATENT DOCUMENTS

| | | | | |
|---|---|---|---|---|
| 3,800,240 | A * | 3/1974 | Zelenz | 330/52 |
| 4,216,451 | A | 8/1980 | Nishimura et al. | 334/15 |
| 4,480,338 | A | 10/1984 | Dobrovolny | 455/188.1 |
| 5,737,035 | A | 4/1998 | Rotzoll | 348/725 |
| 5,898,900 | A | 4/1999 | Richter et al. | 725/70 |
| 5,930,696 | A | 7/1999 | Tzuang et al. | 455/311 |
| 6,118,499 | A | 9/2000 | Fang | 348/726 |
| 6,177,964 | B1 | 1/2001 | Birleson et al. | 348/725 |
| 6,297,858 | B1 | 10/2001 | Yang | 348/731 |
| 6,313,885 | B1 | 11/2001 | Patel et al. | 348/725 |
| 6,831,497 | B2 * | 12/2004 | Koh et al. | 327/254 |
| 6,909,470 | B2 | 6/2005 | Mizukami et al. | 348/726 |
| 6,925,291 | B2 * | 8/2005 | Pugel | 455/191.1 |
| 6,931,083 | B1 | 8/2005 | Linder et al. | 375/345 |
| 7,006,162 | B2 | 2/2006 | Cowley et al. | 348/731 |
| 2003/0032398 | A1 | 2/2003 | Harris | 455/147 |
| 2005/0024544 | A1 | 2/2005 | Waight et al. | 348/731 |
| 2005/0096004 | A1 | 5/2005 | Tso et al. | 455/334 |

FOREIGN PATENT DOCUMENTS

| | | |
|---|---|---|
| EP | 1 282 227 A2 | 2/2003 |
| EP | 1 345 324 A2 | 9/2003 |
| EP | 1 345 324 A3 | 12/2004 |
| JP | 359100613 * | 6/1984 |

OTHER PUBLICATIONS

Nathan R. Belk et al., "An Integrated Channel Filter and Method of Operation," Pending U.S. Appl. No. 10/694,074, 29 pages plus 4 pages of drawings, Oct. 27, 2003.

(Continued)

*Primary Examiner*—Dinh T. Le
(74) *Attorney, Agent, or Firm*—Baker Botts L.L.P.

(57) ABSTRACT

A circuit includes a first filter comprising a first inductor coupled to a first variable capacitor, wherein the first filter is associated with a first resonant frequency. The circuit further comprises an amplifier coupled to the first filter and a second filter coupled to the amplifier. The second filter comprises a second inductor coupled to a second variable capacitor, wherein the second filter is associated with a second resonant frequency that is substantially the same as the first resonant frequency. At least a portion of the first filter and at least a portion of the second filter are formed on an integrated circuit.

23 Claims, 2 Drawing Sheets

OTHER PUBLICATIONS

PCT Notification of Transmittal of the International Search Report and the Written Opinion of the International Searching Authority for International Application No. PCT/US2004/032853, 12 pages, Jan. 24, 2005.

PCT Notification of Transmittal of the International Search Report and the Written Opinion of the International Searching Authority for International Application No. PCT/US06/14349, 9 pages, Aug. 7, 2006.

* cited by examiner

INTEGRATED CHANNEL FILTER USING MULTIPLE RESONANT FILTERS AND METHOD OF OPERATION

TECHNICAL FIELD OF THE INVENTION

This invention relates in general to signal processing, and more particularly to an integrated channel filter using multiple resonant filters.

BACKGROUND OF THE INVENTION

It is desired to have a low noise amplifier (LNA) with a bandpass filter response and adjustable center frequency. A single resonant filter in the emitter leg of the LNA is not adequate due to the presence of an additional resonance caused by a collector load inductor and parasitic capacitances. The resonance in the collector leg of the LNA does not necessarily occur at the same frequency as the resonance in the emitter filter, and therefore causes an undesirable broadening of the bandpass filter response.

SUMMARY OF THE INVENTION

In accordance with the present invention, the disadvantages and problems associated with prior amplifiers have been substantially reduced or eliminated.

In accordance with one embodiment of the present invention, a circuit includes a first filter comprising a first inductor coupled to a first variable capacitor, wherein the first filter is associated with a first resonant frequency. The circuit further comprises an amplifier coupled to the first filter and a second filter coupled to the amplifier. The second filter comprises a second inductor coupled to a second variable capacitor, wherein the second filter is associated with a second resonant frequency that is substantially the same as the first resonant frequency. At least a portion of the first filter and at least a portion of the second filter are formed on an integrated circuit.

The following technical advantages may be achieved by some, none, or all of the embodiments of the present invention.

Particular technical advantages of the present invention are achieved because the filters are formed at least in part on an integrated circuit. For example, filters that are not formed on the integrated circuit propagate the desired channels but reflect the undesired channels back to the transmitter or other source of the input signal. This reflection of undesired channels tends to corrupt all of the channels in the input signal, including the desired channels. The filters which are formed on the integrated circuit communicate the desired channels but do not reflect the undesired channels back to the transmitter or source of the input signal. Instead, the undesired channels are dissipated in various components, such as the lossy elements, of the integrated circuit. The corruption of the desired channels is therefore no longer a significant issue.

By adjusting the capacitances of the two resonant filters, such that their resonant frequencies are aligned with each other, a sharper bandpass filter response is achieved. In effect, the quality factor of the filters and the amplifier are higher than alternative circuits with only a single tunable resonant filter. This results in higher gain and greater channel selectivity by the circuit.

These and other advantages, features, and objects of the present invention will be more readily understood in view of the following detailed description and the drawings.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF EXAMPLE EMBODIMENTS OF THE INVENTION

Figure 1:
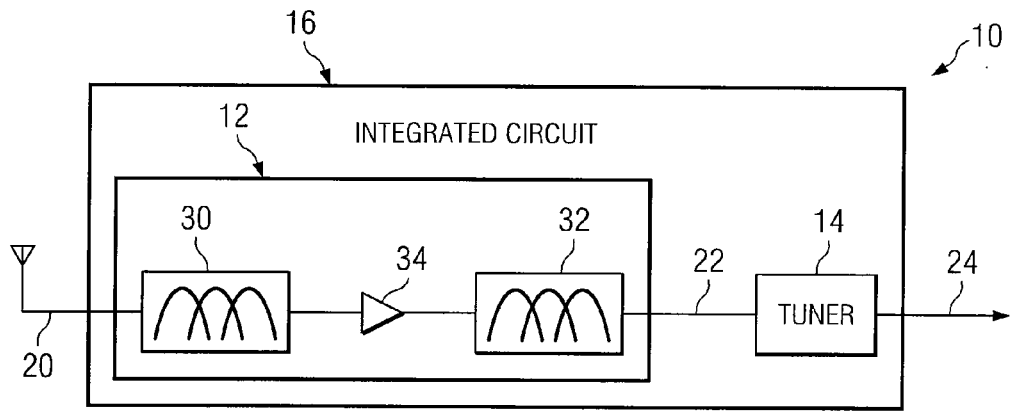
FIG. 1 illustrates one embodiment of a system 10 that includes a pre-select amplifier circuit and a tuner formed on an integrated circuit.

FIG. 1 illustrates one embodiment of a system 10 that includes a pre-select amplifier circuit 12 coupled to a tuner 14. At least portions of circuit 12 and tuner 14 are formed on an integrated circuit 16. In general, circuit 12 receives an input signal 20 comprising a plurality of frequency channels. Circuit 12 filters and amplifies signal 20 for communication to tuner 14 as signal 22. Tuner 14 receives signal 22 and communicates output signal 24. In general, circuit 12 can achieve a higher gain and greater channel selectivity of signal 20 because it includes two resonant filter circuits 30 and 32 that are tuned to substantially the same resonant frequency.

Circuit 12 comprises first filter 30 and second filter 32 coupled to amplifier 34. Filters 30 and 32 comprise any suitable number and combination of frequency selective components that may be formed on integrated circuit 16. In a particular embodiment described in greater detail with reference to FIG. 2, filter 30 comprises a resonant filter that includes an inductor and a parallel combination of capacitors arranged in series with the inductor. Moreover, filter 32 comprises a resonant filter that includes an inductor and a parallel combination of capacitors arranged in parallel with the inductor. At least a portion of the capacitors may be switched in to or out of connection with the inductor of any given filter 30 or 32 to change the frequency selectivity of the particular filter 30 or 32. These and other aspects of circuit 12 are explained in greater detail with reference to FIG. 2.

Particular technical advantages of system 10 are achieved because filters 30 and 32 are formed at least in part on integrated circuit 16. For example, filters that are not formed on the integrated circuit 16 propagate the desired channels of signal 20 but reflect the undesired channels of signal 20 back to the transmitter or other source of the input signal 20. This reflection of undesired channels tends to corrupt all the channels in the input signal 20, including the desired channels. Filters 30 and 32 formed on integrated circuit 16 communicate desired channels but do not reflect the undesired channels back to the transmitter or source of input signal 20. Instead, the undesired channels are dissipated in various components, such as the loss elements of integrated circuit 16. The corruption of the desired channels is therefore no longer a significant issue.

Tuner 14 comprises any suitable number and combination of active and passive components including, but not limited to, gain control modules, mixers, and filters that may extract content from a desired radio frequency spectrum and convert the content into a form that is usable, for example, by an access device. In one embodiment, tuner 14 comprises a television tuner for use in a television system. Although circuit 12 and tuner 14 are illustrated as separate components in FIG. 1, it should be understood that in particular embodiments circuit 12 may be formed integral to tuner 14. For example, circuit 12 may be formed integral to an input stage of tuner 14.

By arranging circuit 12 before or integral to an input stage of tuner 14, system 10 achieves particular technical advantages. For example, the number of intermodulation products produced by the tuner 14 grows as the square of the number of channels that are processed by the tuner 14. Therefore, by filtering a number of the undesired channels from signal 20 prior to the processing performed by tuner 14, circuit 10 eliminates a large percentage of the intermodulation products produced by tuner 14. The range of gain programmability of tuner 14 is therefore increased. The reduction in intermodulation products also tends to reduce many second order intermodulation products (e.g., second order harmonic distortion). Furthermore, as described above, the power and performance requirements for tuner 14 are determined by the number of channels processed by tuner 14. By reducing the number of channels processed by tuner 14, the power consumption and subsequent stages of tuner 14 is reduced.

Input signal 20 comprises a radio frequency signal. In a television system, signals representing individual channels are assigned to specific frequencies in a defined frequency band. For example, in the United States, television signals are generally transmitted in a band from 48 MHz to 852 MHz. In other countries, television signals are generally transmitted in a band from 470 MHz to 900 MHz.

In operation, circuit 12 receives an input signal 20 comprising a number of channels. The desired tuning frequency of tuner 14 is determined. Based on that desired tuning frequency, the capacitor values for filter 30 and filter 32 are set such that the resonant frequency of filter 32 is substantially equal to the resonant frequency of filter 30 which is substantially equal to the desired tuning frequency. As a result, circuit 12 filters input signal 20 to generate signal 22 having channels in a desired frequency band. Moreover, amplifier 34 of circuit 12 amplifies the channels of input signal 20 that are communicated in signal 22. Circuit 12 dissipates undesired channels in lossy elements of integrated circuit 16. Tuner 14 receives signal 22 and communicates an output signal 24 comprising one or more selected channels from the frequency band associated with signal 22. In particular embodiments, the output signal 24 comprises a single channel in the television band.

Figure 2:
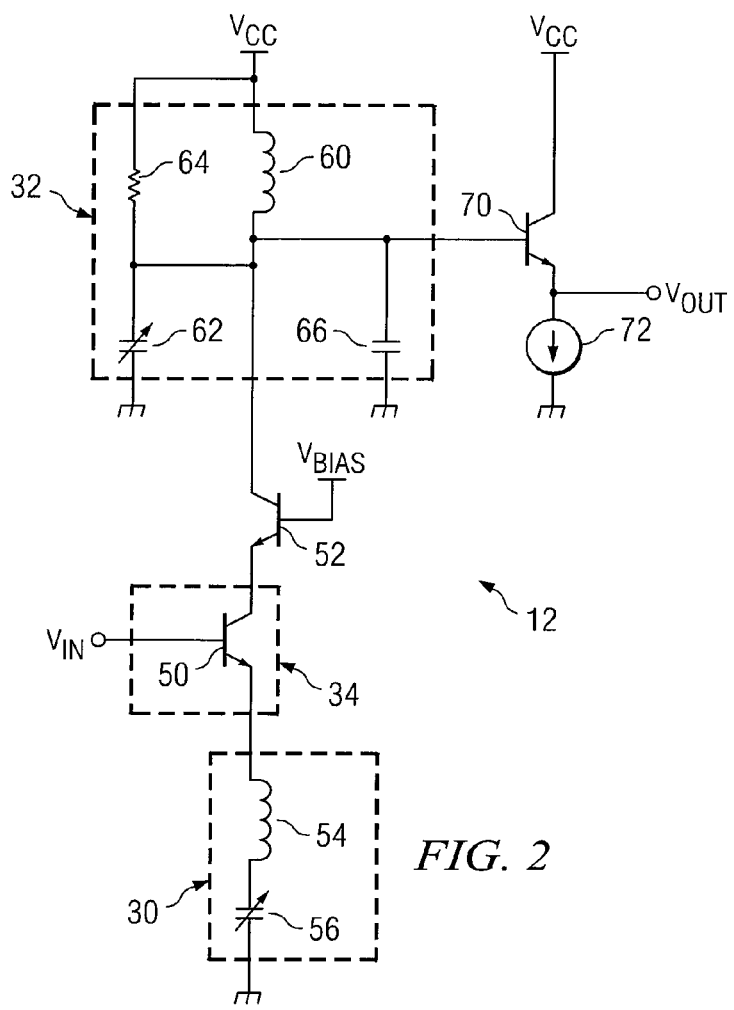
FIG. 2 illustrates one embodiment of the pre-select amplifier circuit depicted in FIG. 1.

FIG. 2 illustrates a particular embodiment of circuit 12 that includes first filter 30, amplifier 34, and second filter 32. Amplifier 34 comprises transistor 50. Transistor 50 comprises a three terminal device. As illustrated, transistor 50 comprises an NPN transistor having a base terminal that receives input signal 20, an emitter terminal coupled to first filter 30, and a collector terminal coupled to transistor 52. First filter 30 comprises an inductor 54 having a first lead coupled to the emitter of transistor 50 and a second lead coupled to variable capacitor 56. Variable capacitor 56 comprises a plurality of capacitors switchably coupled in parallel to each other and in series with inductor 54. Second filter 32 comprises inductor 60 having a first lead coupled to a power source, $V_{cc}$, and a second lead coupled to transistor 52. Second filter 32 further comprises a variable capacitor 62 that comprises a plurality of capacitors switchably coupled in parallel to each other and in parallel with inductor 60. Second filter 32 further comprises a resistor 64 coupled in parallel to inductor 60. Furthermore, second filter 32 comprises parasitic capacitances represented by capacitor 66. Circuit 12 further comprises transistor 70 which operates as an emitter follower coupled to the output of second filter 32 in order to isolate the output of second filter 32 from capacitive loading. Circuit 12 further comprises a current source 72. An output terminal for signal 22 is coupled to the emitter of transistor 70.

First filter 30 exhibits a first resonant frequency, $f_1$, given by the following equation:

$$f_1 = \frac{1}{2\pi\sqrt{L_1 C_1}}$$

where:
 $L_1$=inductor 54; and
 $C_1$=variable capacitor 56.

Second filter 32 exhibits a second resonant frequency, $f_2$, given by the following equation:

$$f_2 = \frac{1}{2\pi\sqrt{L_2(C_2 + C_p)}}$$

where:
 $L_2$=inductor 60;
 $C_2$=variable capacitor 62; and
 $C_p$=parasitic capacitance 66.

As can be seen from the formulas above, first resonant frequency $f_1$ is based upon the value of the first inductor 54 and the value of the first variable capacitor 56. In one embodiment, the value of first inductor 54 is fixed and the first resonant frequency, $f_1$, is tuned by switching in or out one or more of the capacitors that make up variable capacitor 56. Again, this may be done in response to the desired tuning frequency as selected using tuner 14. The second resonant frequency, $f_2$, is based upon not only second inductor 60 and second variable capacitor 62, but also based upon parasitic capacitance 66. In general, second inductor 60 and parasitic capacitance 66 are fixed and the value of second resonant frequency, $f_2$, is tuned by switching in or out one or more capacitors that make up variable capacitor 62. To operate circuit 12, the second resonant frequency $f_2$ is tuned such that it substantially equals the first resonant frequency $f_1$. By adjusting the capacitances of the two resonant filters 30 and 32 such that their resonant frequencies are aligned with each other, a sharper bandpass filter response is achieved, as illustrated with respect to FIGS. 3A and 3B. In effect, the quality factor of the circuit 12 is higher than alternative circuits with only a single tunable resonant filter 30. This results in higher gain and greater channel selectivity by circuit 12.

As can be seen by FIG. 2, circuit 12 combines a tunable resonant filter 32 at the collector terminal of transistor 52 in addition to the tunable resonant filter 30 at the emitter terminal of transistor 50. A variable capacitor 62 is placed within second resonant filter 32 such that the resonant frequency of the inductor 60, parasitic capacitance 66, and variable capacitor 62 coincides with the resonant frequency of the tunable first resonant filter 30. In addition, the output of transistor 50 is buffered from following stages in order to reduce the capacitive load and also to provide a known capacitive load.

Figure 3A:
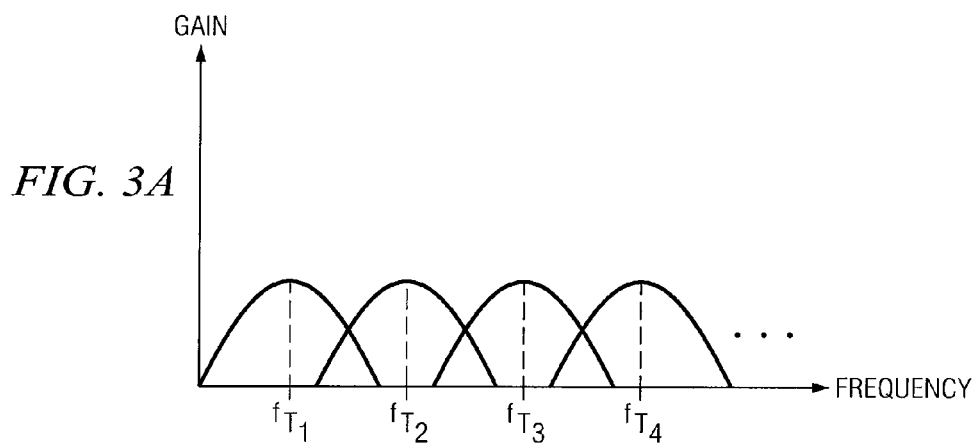
FIGS. 3A-3B illustrate the bandpass filter responses of the filters in the pre-select amplifier circuit depicted in FIG. 2.
Figure 3B:
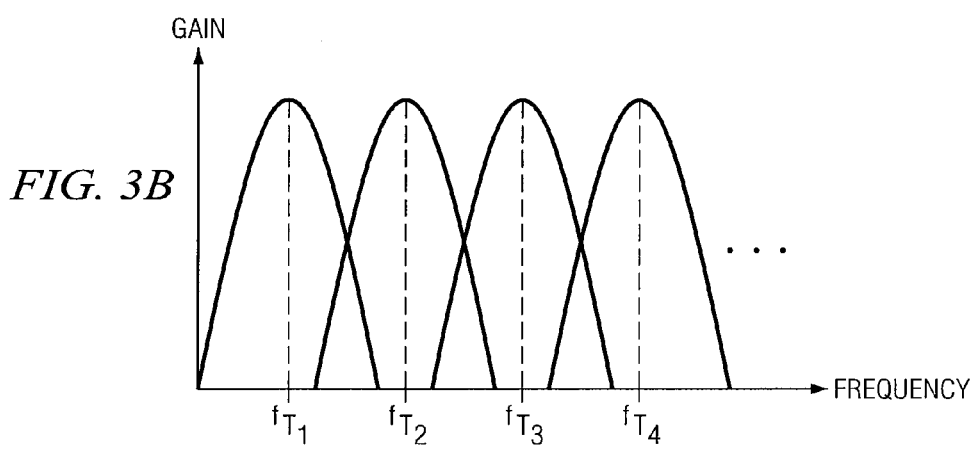

FIG. 3A illustrates an example bandpass filter response of a circuit 12 that includes only first filter 30 and amplifier 34. The graph of FIG. 3A plots frequency along the x-axis and gain (e.g., $V_{out}/V_{in}$) along the y-axis. FIG. 3B illustrates an example bandpass filter response of a circuit 12 that includes amplifier 34 coupled to both first resonant filter 30 and second resonant filter 32, as depicted in FIGS. 1 and 2. As with FIG. 3A, FIG. 3B plots frequency along the x-axis and gain along the y-axis. As can be seen by the bandpass filter response of FIG. 3B as compared to the bandpass filter response of FIG. 3A, a sharper bandpass filter response with higher gain is achievable using first and second resonant filters 30 and 32 as opposed to a single resonant filter 30. In particular, by adjusting the capacitances of resonant filters 30 and 32 such that their resonant frequencies are aligned with each other, a sharper bandpass filter response is achieved. This results in higher gain and greater channel selectivity by circuit 12. The filter responses of circuit 12 may vary from the example filter responses illustrated in FIGS. 3A-3B without departing from the scope of this disclosure.

Figure 4A:
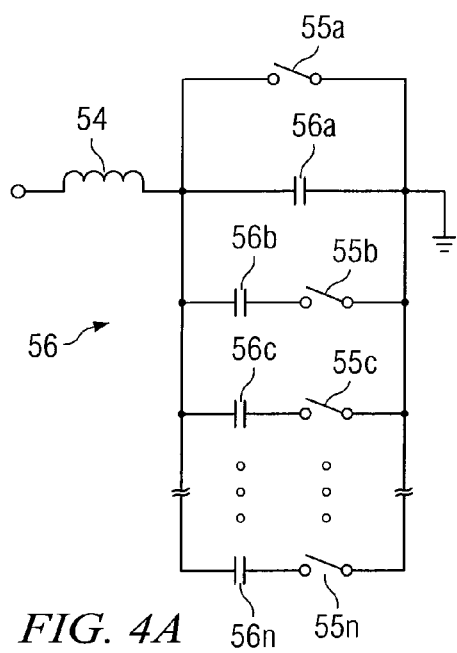
FIGS. 4A-4B illustrate variable capacitors used in the filters of the pre-select amplifier circuit of FIG. 2.
Figure 4B:
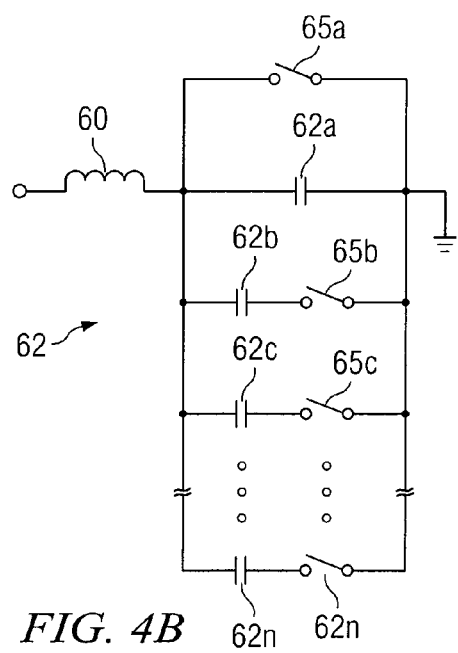

FIGS. 4A-4B illustrate particular embodiments of variable capacitors 56 and 62, respectively. Referring to FIG. 4A, variable capacitor 56 comprises a parallel combination of capacitors 56a-56n switchably coupled to each other. Variable capacitor 56 is coupled in series to inductor 54. In particular, a second capacitor 56b is switchably coupled in parallel to first capacitor 56a. A third capacitor 56c is switchably coupled in parallel to first capacitor 56a. An $n^{th}$ capacitor 56n is switchably coupled in parallel to first capacitor 56a. Therefore, signals associated with capacitors 56b through 56n are switchably coupled to a signal associated with capacitor 56a. The selected combination of capacitors, 56a through 56n, may be referred to collectively as capacitors 56 and generally as variable capacitor 56. Capacitors 56 each have a first terminal coupled to a terminal of inductor 54. First capacitor 56a has a second terminal coupled to ground. A first switch 55a shorts inductor 54 to ground. A second switch 55b couples the second terminal of second capacitor 56b to the second terminal of first capacitor 56a. A third switch 55c couples the second terminal of third capacitor 56c to the second terminal of first capacitor 56a. Switches 55 are selectively enabled based upon a command signal received by circuit 12.

Referring to FIG. 4B, variable capacitor 62 comprises a parallel combination of capacitors 62a-62n switchably coupled to each other. Variable capacitor 62 is coupled in parallel to inductor 60. In particular, a second capacitor 62b is switchably coupled in parallel to first capacitor 62a. A third capacitor 62c is switchably coupled in parallel to first capacitor 62a. An $n^{th}$ capacitor 62n is switchably coupled in parallel to first capacitor 62a. Therefore, signals associated with capacitors 62b through 62n are switchably coupled to a signal associated with capacitor 62a. The selected combination of capacitors, 62a through 62n, may be referred to collectively as capacitors 62 and generally as variable capacitor 62. Capacitors 62 each have a first terminal coupled to a terminal of inductor 60. First capacitor 62a has a second terminal coupled to ground. A first switch 65a shorts inductor 60 to ground. A second switch 65b couples the second terminal of second capacitor 62b to the second terminal of first capacitor 62a. A third switch 65c couples the second terminal of third capacitor 62c to the second terminal of first capacitor 62a. Switches 65 are selectively enabled based upon a command signal received by circuit 12.

The components of variable capacitors 56 and 62 are formed on integrated circuit 16. The values of capacitors 56 and 62 may be selected within a particular filter 30 or 32 such that the appropriate combinations of capacitors 56 and 62 within any given filter 30 or 32 coupled in series with inductor 54 or in parallel with inductor 60, respectively, provide appropriate resonant frequencies and, therefore, bandpass filtering about appropriate center frequencies. For example, the resonant frequency for filter 32 will depend not only upon the value of the capacitors 62, but also upon the value of parasitic capacitances 66 and inductor 60. As a result, the values of capacitors 56 may or may not be the same as the values of capacitors 62. Although FIGS. 4A-4B illustrate variable capacitors 56 and 62 having particular numbers and arrangements of capacitors, it should be understood that any given variable capacitor 56 and 62 may have any suitable number and arrangement of capacitors to derive a desired level of granularity associated with the ranges of frequency selection.

Although the present invention has been described in detail, it should be understood that various changes, substitutions and alterations can be made hereto without departing from the scope of the invention as defined by the appended claims.

What is claimed is:

1. A circuit, comprising:
   a first filter comprising a first inductor coupled to a first variable capacitor, wherein the first filter is associated with a first resonant frequency;
   an amplifier coupled to the first filter;
   a second filter coupled to the amplifier and comprising a second inductor coupled to a second variable capacitor, wherein the second filter is associated with a second resonant frequency that is substantially the same as the first resonant frequency; and
   a buffer circuit coupled to the second filter and operable to buffer the output of the second filter from capacitive loading;
   wherein at least a portion of the first filter and at least a portion of the second filter are formed on an integrated circuit.

2. The circuit of claim 1, wherein the first variable capacitor comprises a plurality of capacitors switchably coupled to each other, each capacitor having a value that is selected to achieve a particular first resonant frequency.

3. The circuit of claim 1, wherein the second variable capacitor comprises a plurality of capacitors switchably coupled to each other, each capacitor having a value that is selected to achieve a particular second resonant frequency.

4. The circuit of claim 3, wherein the second variable capacitor further comprises parasitic capacitances that contribute to the second resonant frequency.

5. The circuit of claim 1, wherein the first resonant frequency is based at least in part upon the value of the first inductor and the value of the first variable capacitor.

6. The circuit of claim 1, wherein the second resonant frequency is based at least in part upon the value of the second inductor and the value of the second variable capacitor.

7. The circuit of claim 1, wherein the first resonant frequency and the second resonant frequency are determined according to a desired tuning frequency.

8. The circuit of claim 1, wherein the buffer circuit comprises an emitter follower circuit.

9. The circuit of claim 1, wherein the circuit is operable to process a signal having a frequency in the range from 470 MHz to 900 MHz.

10. The circuit of claim 1, further comprising a tuner communicatively coupled to the buffer circuit, wherein at least a portion of the tuner is formed on the integrated circuit.

11. A circuit, comprising:
   a first filter comprising a first inductor coupled to a first variable capacitor, wherein the first filter is associated with a first resonant frequency;
   an amplifier coupled to the first filter;
   a second filter coupled to the amplifier and comprising a second inductor coupled to a second variable capacitor, wherein the second filter is associated with a second resonant frequency that is substantially the same as the first resonant frequency;
   an emitter follower circuit coupled to the second filter and operable to buffer the output of the second filter from capacitive loading; and
   a tuner communicatively coupled to the emitter follower circuit;
   wherein at least a portion of the first filter, at least a portion of the second filter, and at least a portion of the tuner are formed on an integrated circuit.

12. The circuit of claim 11, wherein the first variable capacitor comprises a plurality of capacitors switchably coupled to each other, each capacitor having a value that is selected to achieve a particular first resonant frequency.

13. The circuit of claim 11, wherein the second variable capacitor comprises a plurality of capacitors switchably coupled to each other, each capacitor having a value that is selected to achieve a particular second resonant frequency.

14. The circuit of claim 13, wherein the second variable capacitor further comprises parasitic capacitances that contribute to the second resonant frequency.

15. The circuit of claim 11, wherein the first resonant frequency is based at least in part upon the value of the first inductor and the value of the first variable capacitor.

16. The circuit of claim 11, wherein the second resonant frequency is based at least in part upon the value of the second inductor and the value of the second variable capacitor.

17. The circuit of claim 11, wherein the first resonant frequency and the second resonant frequency are determined according to a desired tuning frequency.

18. The circuit of claim 1, wherein the circuit is operable to process a signal having a frequency in the range from 470 MHz to 900 MHz.

19. A circuit, comprising:
   a transistor having a first terminal to receive an input signal, a second terminal, and a third terminal;
   a first inductor having a first lead coupled to the second terminal of the transistor and a second lead;
   a first variable capacitor coupled to the second lead of the first inductors, wherein the first inductor and first variable capacitor form a first filter;
   a second variable capacitor communicatively coupled to the third terminal of the transistor;
   a second inductor having a first lead coupled to a power source and a second lead coupled to the third terminal of the transistor, wherein the second inductor and second variable capacitor form a second filter; and
   a buffer circuit coupled to the second filter and operable to buffer an output of the second filter from capacitive loading;
   wherein the second resonant frequency is substantially equal to the first resonant frequency.

20. The circuit of claim 19, wherein:
   the first variable capacitor comprises a first plurality of capacitors switchably coupled to each other, each capacitor having a value that is selected to achieve a particular first resonant frequency; and
   the second variable capacitor comprises a second plurality of capacitors switchably coupled to each other, each capacitor having a value that is selected to achieve a particular second resonant frequency;
   the second variable capacitor further comprising parasitic capacitances that contribute to the second resonant frequency.

21. The circuit of claim 19, wherein at least a portion of the first filter and at least a portion of the second filter are formed on an integrated circuit.

22. The circuit of claim 21, further comprising a tuner communicatively coupled to an output of the second filter, wherein at least a portion of the tuner is formed on the integrated circuit.

23. The circuit of claim 22, wherein the circuit is operable to process a signal having a frequency in the range from 470 MHz to 900 MHz.

* * * * *